United States Patent
Robbs et al.

(10) Patent No.: US 11,232,829 B2
(45) Date of Patent: *Jan. 25, 2022

(54) APPARATUSES AND METHODS FOR SENSE LINE ARCHITECTURES FOR SEMICONDUCTOR MEMORIES

(71) Applicant: MICRON TECHNOLOGY, INC., Boise, ID (US)

(72) Inventors: Toby D. Robbs, Boise, ID (US); Charles L. Ingalls, Meridian, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/814,863

(22) Filed: Mar. 10, 2020

(65) Prior Publication Data
US 2020/0211625 A1 Jul. 2, 2020

Related U.S. Application Data

(63) Continuation of application No. 15/857,327, filed on Dec. 28, 2017, now Pat. No. 10,607,687.

(51) Int. Cl.
| | |
|---|---|
| *G11C 11/4091* | (2006.01) |
| *H01L 27/108* | (2006.01) |
| *G11C 11/4097* | (2006.01) |

(52) U.S. Cl.
CPC ...... *G11C 11/4091* (2013.01); *G11C 11/4097* (2013.01); *H01L 27/10897* (2013.01)

(58) Field of Classification Search
CPC ....... H01L 27/10897; H01L 2924/1435; H01L 27/11286; H01L 27/11514;
(Continued)

(56) References Cited

U.S. PATENT DOCUMENTS

| | | |
|---|---|---|
| 5,107,459 A | 4/1992 | Chu et al. |
| 5,864,181 A | 1/1999 | Keeth |

(Continued)

FOREIGN PATENT DOCUMENTS

JP 2017168623 A 9/2017

OTHER PUBLICATIONS

International Search Report and Written Opinion for PCT Application No. PCT/US2018/066558 dated Apr. 12, 2019, pp. all.

(Continued)

*Primary Examiner* — Thanh Y. Tran
(74) *Attorney, Agent, or Firm* — Dorsey & Whitney LLP

(57) ABSTRACT

Apparatuses and methods for sense line architectures for semiconductor memories are disclosed. An example apparatus includes a first array region including first portions of a plurality of sense lines and memory cells coupled to the first portions of the plurality of sense lines and further includes a second array region including second portions of the plurality of sense lines and memory cells coupled to the second portions of the plurality of sense lines. An array gap is disposed between the first and second array regions and includes third portions of the plurality of sense lines and does not include any memory cells. Each third portion of the plurality of sense lines includes conductive structures having vertical components configured to couple the first portions and second portions of the plurality of sense lines to provide an electrically continuous sense lines through the first and second array regions and the array gap.

20 Claims, 5 Drawing Sheets

(58) Field of Classification Search
CPC . G11C 11/4091; G11C 11/4097; G11C 7/065;
G11C 7/18; G11C 5/063
See application file for complete search history.

(56) References Cited

U.S. PATENT DOCUMENTS

| | | | |
|---|---|---|---|
| 6,034,879 | A | 3/2000 | Min et al. |
| 6,043,562 | A | 3/2000 | Keeth |
| 6,084,816 | A | 7/2000 | Okamura |
| 6,567,288 | B2 | 5/2003 | Keeth |
| 7,259,464 | B1 | 8/2007 | Batra |
| 10,607,687 | B2 * | 3/2020 | Robbs .................. G11C 11/4097 |
| 2001/0030899 | A1 | 10/2001 | Keeth |
| 2002/0024144 | A1 | 2/2002 | Keeth |
| 2002/0125538 | A1 | 9/2002 | Abedifard et al. |
| 2005/0047191 | A1 | 3/2005 | Watanabe |
| 2005/0135137 | A1 | 6/2005 | Lee et al. |
| 2005/0174866 | A1 | 8/2005 | Wada et al. |
| 2011/0134678 | A1 * | 6/2011 | Sato .................. H01L 27/10885 |
| | | | 365/63 |
| 2015/0130068 | A1 | 5/2015 | Lin et al. |
| 2016/0196879 | A1 | 7/2016 | Helm et al. |
| 2019/0051335 | A1 * | 2/2019 | Nagata ..................... G11C 11/22 |

OTHER PUBLICATIONS

English translation of Office Action for KR Application No. 10-2020-7020688, dated May 31, 2021.
EP Search Report dated Jul. 14, 2021 for EP Appl. No. 18895253.5.
Translation of JP Office Action dated Aug. 24, 2021 for JP Appl. No. 2020-536240.

* cited by examiner

APPARATUSES AND METHODS FOR SENSE LINE ARCHITECTURES FOR SEMICONDUCTOR MEMORIES

CROSS-REFERENCE TO RELATED APPLICATION

This application is a continuation of U.S. patent application Ser. No. 15/857,327, filed Dec. 28, 2017, U.S. patent Ser. No. 10/607,687 issued on Mar. 31, 2020. This application and patent are incorporated by reference herein in their entirety and for all purposes.

BACKGROUND

In memory ICs, such as random access memories (RAMs), the data in the memory array are accessed by an external data path by means of a number of electrically conducting lines. The electrically conducting lines in the array are conventionally arranged in the form of an array of parallel metallization strips. For example, a dynamic RAM (DRAM) contains an array of hundreds of parallel sense lines (e.g., digit lines). A DRAM also contains an array of parallel access lines (e.g., word lines). The access lines, typically lie at a different planar level than the sense lines. The array of sense lines and the array of access lines lie perpendicular to each other, forming a grid. Memory cells in the DRAM lie at an intersection of an access line and a sense line.

The sense lines in a DRAM can give rise to electrical cross-coupling or "cross-talk." For example, access to any given sense line may spuriously influence memory cells connected to adjacent sense lines. The term "pattern sensitivity" is applied to this undesirable phenomenon. The problems of cross-talk and pattern sensitivity can arise in other interconnection arrays, such as address busses and data busses where similarly paired, parallel disposed line conductors are employed. In these environments, cross-talk and pattern sensitivity can result in undesirable errors.

Some memories include a twisted sense line architecture having sense lines that are "twisted" to reduce the negative effects of electrical cross-talk and pattern sensitivity. Conventional twisted sense line architectures have a number of disadvantages. One disadvantage is the relatively large amount of chip "real estate" that is typically used by twist junctions where the sense lines are twisted. Yet another disadvantage is that the use of the conventional twisted sense line architecture may result in an inefficient use of the memory cell array space. The conventional twisted sense line architecture does not use space efficiently because it may provide a lower packing density of memory cells than other sense line architecture.

There is a need for a new array architecture including twisted sense lines that may avoid the negative effects of conventional twisted sense line architectures.

DETAILED DESCRIPTION

Certain details are set forth below to provide a sufficient understanding of examples of the disclosure. However, it will be clear to one having skill in the art that examples of the disclosure may be practiced without these particular details. Moreover, the particular examples of the present disclosure described herein should not be construed to limit the scope of the disclosure to these particular examples. In other instances, well-known circuits, control signals, timing protocols, and software operations have not been shown in detail in order to avoid unnecessarily obscuring embodiments of the disclosure. Additionally, terms such as "couples" and "coupled" mean that two components may be directly or indirectly electrically and/or physically coupled. Indirectly coupled may imply that two components are coupled through one or more intermediate components.

Figure 1:
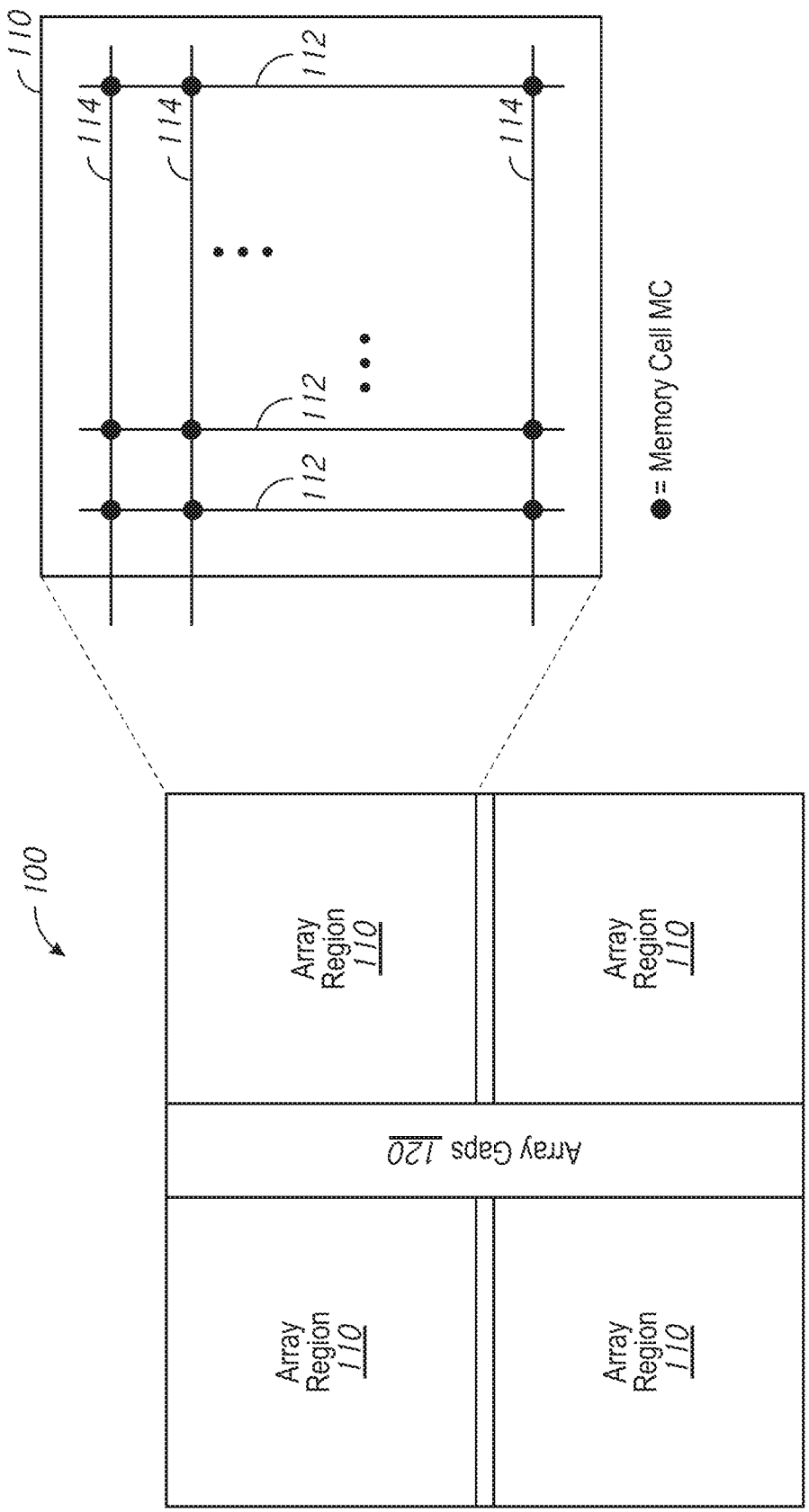
FIG. 1 is a block diagram of a portion of a memory array according to an embodiment of the disclosure.

FIG. 1 is a block diagram of a portion of a memory array 100 according to an embodiment of the disclosure. The memory array 100 includes memory cells MC in array regions 110 and further includes array gaps 120 disposed between the array regions. The memory cells in the array regions 110 are organized along access lines 112 and sense lines 114, with a memory cell positioned at the intersections of the access lines 112 and sense lines 114. The memory cells of the memory array may be various types of memory cells. For example, the memory cells may be volatile memory cells, non-volatile memory cells, and may have different memory cell structures and use various types of materials for the structures. The scope of the disclosure is not intended to be limited to any particular type of memory cells.

The access lines 112 are generally perpendicular in direction to the sense lines 114 of the array regions 110. The sense lines 114 extend along a direction through the respective array regions 110. Memory cells are not positioned in the array gaps 120, but the sense lines 114 may be electrically continuous through the array gap 120 from one array region 110 to an adjacent array region 110. As will be described in more detail below, at least some of the sense lines 114 extending through the array gap 120 from one array region 110 to an adjacent array region 110 twist in the array gap 120. As previously described, twisting sense lines may reduce the negative effects of electrical cross-talk and pattern sensitivity of the sense lines.

Figure 2:
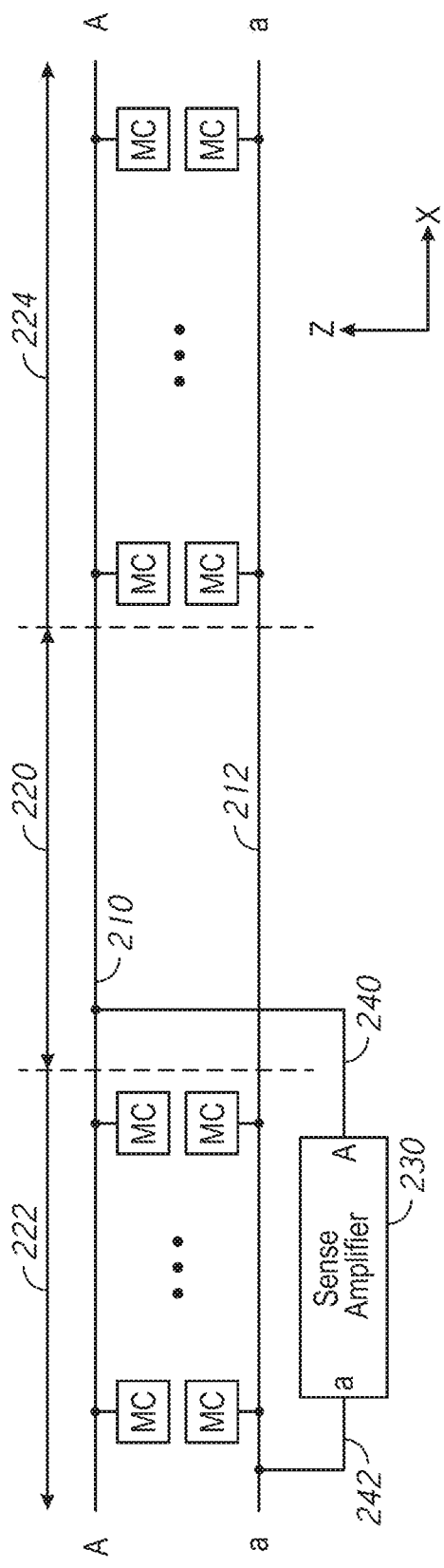
FIG. 2 is a diagram of a portion of a memory array.

FIG. 2 is a diagram of a portion of a memory array. The portion shown in FIG. 2 includes sense lines 210 (also identified by "A") and 212 (also identified by "a") and memory cells MC coupled to sense lines 210 and 212. The memory cells MC are included in an array region 222 and in an array region 224. The array regions 222 and 224 are separated by an array gap 220 disposed therebetween. A sense amplifier 230 is coupled to the sense lines 210 and 212 by interconnects 240 and 242, respectively. The sense lines 210 and 212 may be formed from various conductive materials, including layers of conductive materials as well as conductive vias between the layers of conductive materials. Similarly, the interconnects 240 and 242 that couple the sense amplifier 230 to the sense lines 210 and 212 may also be formed from various conductive materials, including layers of conductive materials as well as conductive vias between the layers of conductive materials.

The portion of the memory of FIG. 2 shown in FIG. 2 is arranged along vertical and horizontal dimensions, with the z-axis indicating the vertical dimension and the x-axis indicating the horizontal dimension. For example, the sense line 212 is positioned below the sense line 210. The array regions 222 and 224 are laterally separated by the array gap 220. Memory cells MC are not positioned in the array gap 220.

The arrangement of the portion of the memory array shown in FIG. 2 is susceptible to issues related to the sense lines 210 and 212 cross-coupling to adjacent sense lines (not shown in FIG. 2) as well as to one another. As previously described, coupling of the sense lines may result in errors when reading data.

Figure 3:
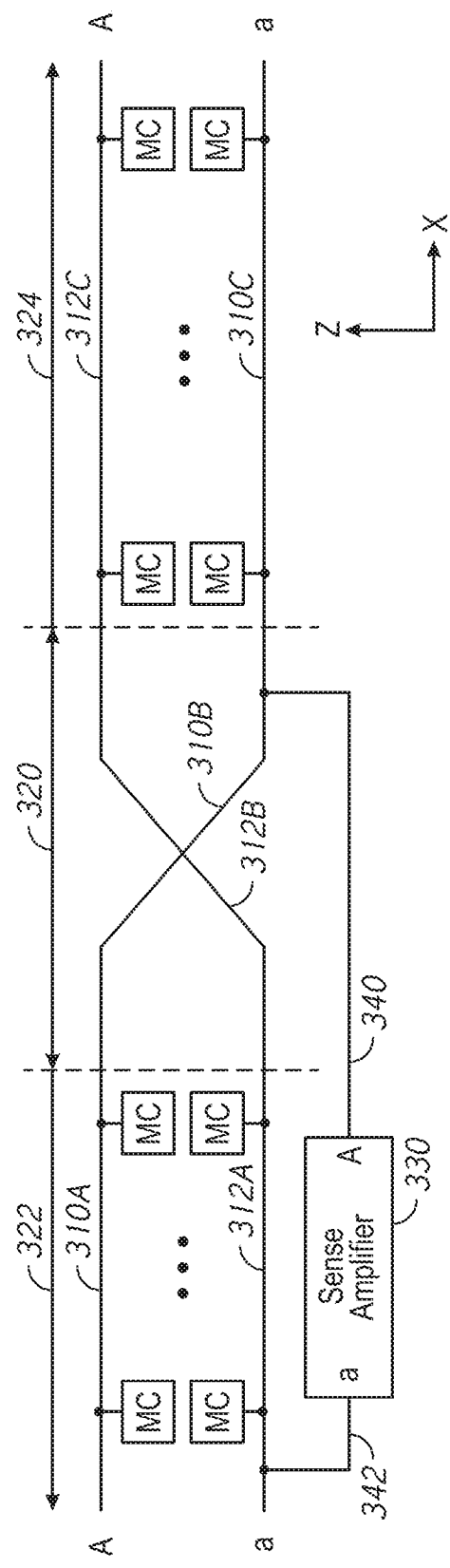
FIG. 3 is a diagram of a portion of a memory array according to an embodiment of the disclosure.

FIG. 3 is a diagram of a portion of a memory array according to an embodiment of the disclosure. The portion of the memory array of FIG. 3 may be included in the portion of the memory array 100 of FIG. 1 in some embodiments of the disclosure.

The portion of the memory array shown in FIG. 3 includes sense lines 310 (also identified by "A") and 312 (also identified by "a"), and further including memory cells MC coupled to sense lines 310 and 312. The memory cells MC are included in an array region 322 and in an array region 324. The array regions 322 and 324 are separated by an array gap 320 disposed therebetween. A sense amplifier 330 is coupled to the sense lines 310 and 312 by interconnects 340 and 342, respectively. The sense line 310 is coupled to a first node of the sense amplifier (node A) and the sense line 312 is coupled to a second node of the sense amplifier (node a).

The memory cells MC may be used to store data to be read at a later time. When activated (e.g., when activated using an access line, such as a word line) the memory cells may be accessed to read data and/or write data. The memory cells MC may be various types of memory cells, and may have various memory cell structures, and may be formed from different types of materials. In some embodiments of the disclosure, the memory cells may be volatile memory cells and in other embodiments of the disclosure, the memory cells may be nonvolatile memory cells. In some embodiments of the disclosure, a memory cell may be coupled to both the sense lines 310 and 312, rather than being coupled to one sense line or the other.

The sense lines 310 and 312 are electrically continuous along the entire length. The sense lines 310 and 312 may be formed from various conductive materials, including layers of conductive materials as well as conductive vias between the layers of conductive materials. Similarly, the interconnects 340 and 342 that couple the sense amplifier 330 to the sense lines 310 and 312 may also be formed from various conductive materials, including layers of conductive materials as well as conductive vias between the layers of conductive materials.

The portion of the memory of FIG. 3 shown in FIG. 3 is arranged along vertical and horizontal dimensions, with the z-axis indicating the vertical dimension (e.g., z-direction) and the x-axis indicating the horizontal direction (e.g., x-direction). The array regions 322 and 324 are laterally separated by the array gap 320. Memory cells MC are not positioned in the array gap 320. The sense amplifier 330 may be positioned below the sense lines 310 and/or 312 in some embodiments of the disclosure. Additionally, in some embodiments of the disclosure, the sense amplifier 330 is not positioned in the array gap 320. The sense amplifier 330 may be positioned beneath the sense lines 310 and 320, and have a portion or be entirely positioned in an array region in some embodiments of the disclosure.

The sense line 310 includes portions 310A, 310B, and 310C, and sense line 312 includes portions 312A, 312B, and 312C. The portions 310A and 312A include at least a portion in the array region 322 and the portions 310C and 312C include at least a portion in the array region 324. The portions 310B and 312B are included in the array gap 320. The portion 310A is positioned above the portion 312A and the portion 310C is positioned below the portion 312C. That is, one of the sense lines has a portion that is above the other sense line for an array region, and has another portion that is below the other sense line for another array region.

The two portions of a sense line are coupled together by a line portions (e.g., portion 310B or portion 312B) that have a vertical component (e.g., along the z-direction) to couple the sense line portions from one layer to another layer. The sense line portions 310B and 312B coupling the other sense line portions (e.g., 310A and 310C and sense line portions 312A and 312C, respectively) of two different layers are positioned in the array gap 320. The portions 310A and 3120 may be formed from the same layer of conductive material, and the portions 312A and 310C may be formed from the same layer of conductive material. The sense line portions 310B and 312B may include conductive layers and conductive vias coupling one conductive layer to another. The conductive layers and conductive vias included in the sense line portions 310B and 312B may provide the vertical component coupling one portion of the sense line of one array region to the other portion of the sense line of another array region. The layers of conductive material may be separated by one or more layers of dielectric materials.

The sense line portions 310B and 312B provide a twist for the sense lines 310 and 312 that may reduce cross-coupling between adjacent sense lines. Positioning the sense line portions 310B and 312B avoids fabrication difficulties with providing a twist for a sense line in the array regions (e.g., array region 322 or 324), such as difficulties with fabrication and layout of the array region and the twist portion in the array region.

Additionally, the vertical arrangement of the sense lines 310 and 312 including the sense line portions 310B and 312B having vertical components allows for additional sense lines to be closely positioned adjacent to the sense lines 310 and 312. For example, additional sense lines may be positioned along a y-direction that is perpendicular to the x-direction and the z-direction (e.g., into and out of the page of FIG. 3).

Figure 4:
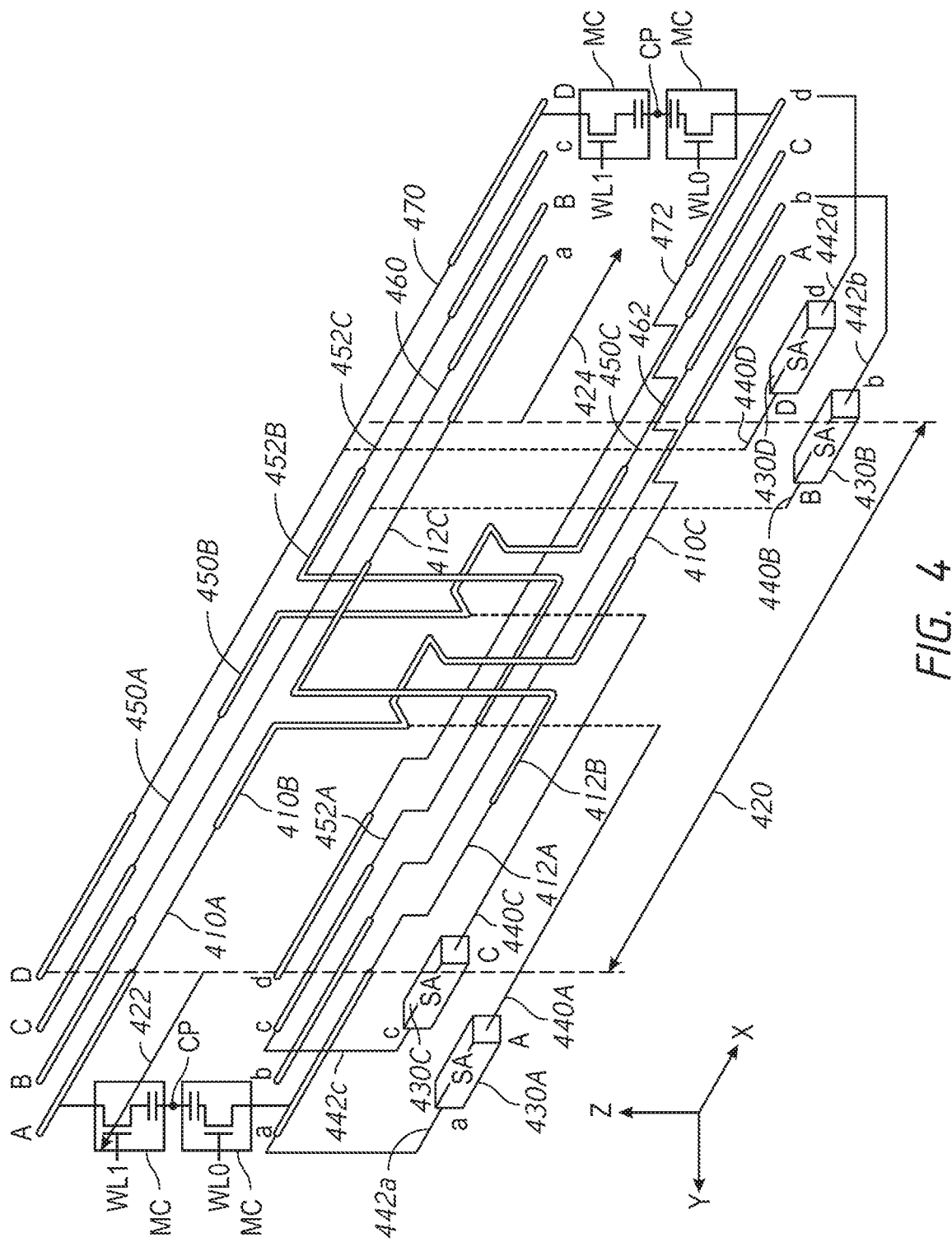
FIG. 4 is a diagram of a representation for an arrangement for adjacent sense lines according to an embodiment of the disclosure.

FIG. 4 is a diagram of an arrangement for adjacent sense lines according to an embodiment of the disclosure. FIG. 4 illustrates four pairs of sense lines 410 and 412 (sense lines A and a), 450 and 452 (sense lines C and c), 460 and 462 (sense lines B and b), and 470 and 472 (sense lines D and d). The arrangement of adjacent sense lines may be replicated to provide sense lines for a memory array in some embodiments of the disclosure.

The sense lines of FIG. 4 are arranged along vertical and horizontal dimensions, with the z-axis indicating the vertical dimension and the x-axis and y-axis indicating the horizontal dimension. For example, the sense lines A and a, B and b, C and c, and D and d, each generally extend in an x-direction along an x-axis, and the sense lines A and a, B and b, C and c, and D are positioned relative to one another in a y-direction along a y-axis. The sense lines of a pair may be positioned relative to one another in a z-direction along a z-axis. Each pair of sense lines are coupled to a respective sense amplifier: sense lines A and a are coupled to sense amplifier 430A through interconnects 440A and 442a, sense lines B and b are coupled to sense amplifier 430B through interconnects 440B and 442b, sense lines C and c are coupled to sense amplifier 430C through interconnects 440C and 442c, and sense lines D and d are coupled to sense amplifier 430D through interconnects 440D and 442d. Memory cells MC may be coupled to the sense lines A and a, B and b, C and c, and D and d in array regions 422 and/or 424. A memory cell MC may be coupled to one sense line in some embodiments of the disclosure. A memory cell MC may be coupled to two sense lines (e.g., both sense lines of a pair) in some embodiments of the disclosure. The array regions 422 and 424 are laterally separated by an array gap 420 disposed therebetween. Memory cells MC are not positioned in the array gap 420.

The sense lines A and a, B and b, C and c, D and d are electrically continuous along their entire lengths. The sense lines A and a, B and b, C and c, D and d may be formed from various conductive materials, including layers of conductive materials as well as conductive vias between the layers of conductive materials. Similarly, the interconnects 440A-D and 442a-d that couple the sense amplifiers 430A-D to the sense lines A and a, B and b, C and c, D and d may also be formed from various conductive materials, including layers of conductive materials as well as conductive vias between the layers of conductive materials.

The sense line A includes sense line portions 410A, 410B, and 410O and sense line a includes sense line portions 412A, 412B, and 412C. The sense line C includes sense line portions 450A, 450B, and 450C and sense line a includes sense line portions 452A, 452B, and 452C. The sense line portions 410A and 410C are positioned at two different layers with sense line portion 410A at a layer above the layer of sense line portion 410C. Similarly, 4825-5541-3174A the sense line portions 412A and 412C, 450A and 450C, and 452A and 452C are positioned at two different layers. The sense line portion 412A is at a layer below the layer of sense line portion 412C; the sense line portion 450A is at a layer above the layer of sense line portion 450C; and the sense line portion 452A is at a layer below the layer of sense line portion 452C. The sense lines 460 and 462 and the sense lines 470 and 472 generally do not switch relative positions to one another (e.g., from above to below and vice versa) across their lengths from one array region to another array region through the sense gap.

The sense line portions 410B and 412B and 450B and 452B each include a portion that includes a vertical component (e.g., in a z-direction along a z-axis) in the array gap 420. The sense line portion 410B couples the sense line portions 410A and 410C, which are at two different layers. Similarly, the sense line portion 412B couples the sense line portions 412A and 412C, which are at two different layers; the sense line portion 450B couples the sense line portions 450A and 450C, which are at two different layers, and the sense line portion 452B couples the sense line portions 452A and 452C, which are at two different layers. The sense line portions 410A, 412C, 450A, and 452C may be formed from the same layer of conductive material, and the portions 410C, 412A, 450C, and 452A may be formed from the same layer of conductive material. The sense lines 460 and 470 may be formed from the same layer of conductive material and the sense lines 462 and 472 may be formed from the same layer of conductive material. The sense line portions 410B, 412B, 450B, and 452B may include conductive layers and conductive vias coupling one conductive layer to another. The conductive layers and conductive vias included in the sense line portions 410B, 412B, 450B, and 452B may provide the vertical component coupling one portion of the sense line to the other portion of the sense line. The layers of conductive material may be separated by one or more layers of dielectric materials.

The sense line portions 410B and 412B provide a twist for the sense lines 410 and 412, and the sense line portions 450B and 452B provide a twist for the sense lines 450 and 452. However, in the embodiment of FIG. 4, the sense lines 460 and 462 are not twisted relative to one another and the sense lines 470 and 472 are not twisted relative to one another. In such embodiments of the disclosure, pairs of sense lines that are twisted are positioned between pairs of sense lines that are not twisted. However, the disclosure is not limited to such an arrangement, and the arrangement of sense lines shown in FIG. 4 is not intended to limit the scope of the disclosure to any particular arrangement of twisted sense lines and not twisted sense lines.

The twist of sense lines 410 and 412, and the twist of sense lines 450 and 452 may reduce cross-coupling between adjacent sense lines (e.g., between adjacent sense lines A and a, B and b, C and c, D and d shown in FIG. 4). Positioning the sense line portions 410B, 412B, 450B, and 452B in the array gap 420 avoids fabrication difficulties with providing a twist for a sense line in the array regions (e.g., array region 422 or 424), such as difficulties with fabrication and layout of the array region and the twist portion in the array region.

Figure 5:
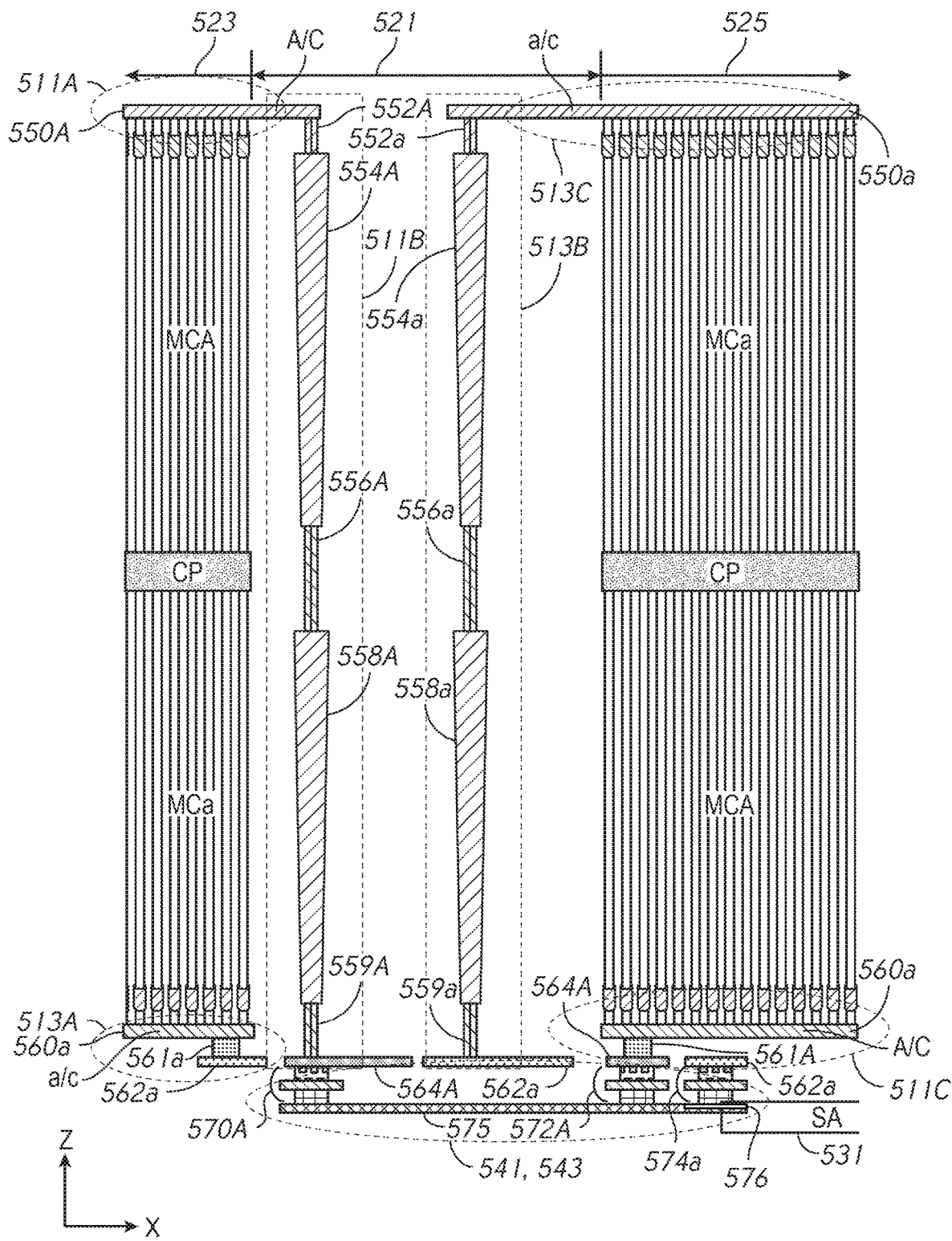
FIG. 5 is a cross-section diagram illustrating an arrangement of sense lines according to an embodiment of the disclosure.

FIG. 5 is a cross-section diagram illustrating an arrangement of sense lines according to an embodiment of the disclosure. The arrangement of sense lines of FIG. 5 may be used for sense lines 410 and 412 and for 450 and 452 of FIG. 4 in some embodiments of the disclosure.

FIG. 5 includes sense lines 511 and 513. The sense line 511 includes sense line portions 511A, 511B, and 511C, and the sense line 513 includes sense line portions 513A, 513B, and 513C. The sense lines 511 and 513 are arranged along vertical and horizontal dimensions, with the z-axis indicating the vertical dimension and the x-axis indicating the horizontal dimension. For example, the sense line portion 511A is at a different layer than the sense line portion za11C, and is coupled to sense line portion za11C by sense line portion 511B. The sense line portion 513A is at a different layer than the sense line portion za13C, and is coupled to sense line portion za13C by sense line portion 513B. In the embodiment of FIG. 5, the sense line portions 511A and 513C are at a layer that is above the layer of sense line portions 513A and 511O.

FIG. 5 further includes memory cells MC and a cell plate CP that is shared by the memory cells MCA and MCa between sense line portions 511A and 513A and by the memory cells MCA and MCa between sense line portions 511C and 513C. The memory cells MCA and MCa and cell plate CP are included in array regions 523 and 525, and the sense line portions 511B and 513B are included in array gap 521 disposed therebetween. The memory cells MCA and MCa may be various types of memory cells, and may have various memory cell structures, and may be formed from different types of materials. In some embodiments of the disclosure, the memory cells may be volatile memory cells and in other embodiments of the disclosure, the memory cells may be nonvolatile memory cells. In some embodiments of the disclosure, a memory cell may be coupled to both the sense lines 511 and 513, rather than being coupled to one or the other, as shown in the embodiment of FIG. 5.

A sense amplifier 531 is coupled to the sense lines 511 and 513 by interconnects 541 and 543, respectively. The sense lines 511 and 513 may be formed from various conductive materials, including layers of conductive materials as well as conductive vias between the layers of conductive materials. Similarly, the interconnects 541 and 543 that couple the sense amplifier 531 to the sense lines 511 and 513 may also be formed from various conductive materials, including layers of conductive materials as well as conductive vias between the layers of conductive materials. The sense amplifier 531 may be positioned below the sense lines 510 and/or 512 in some embodiments of the disclosure. Additionally, in some embodiments of the disclosure, the sense amplifier 531 is not positioned in the array gap 521. The sense amplifier 531 may be positioned beneath the sense lines 511 and 513, and have at least a portion or be entirely positioned in an array region in some embodiments of the disclosure.

For example, the sense line portions 511A and 513C may include the same conductive layer 550 and the sense line portions 513A and 511C may include the same conductive layer 560. The sense line portion 513A further includes conductive via 561a coupled to a conductive layer 562a and the sense line portion 511C further includes conductive via 561A coupled to conductive layer 564A. The sense line portions 511B and 513B include vertical structures, each including one or more conductive vias coupled between the sense line portions 511A and 511C and between the sense line portions 513A and 513C, all respectively, to provide electrically continuous sense lines 511 and 513. The sense line portion 511B includes conductive vias 552A, 554A, 556A, 558A, and 559A, and may include a portion of conductive layer 550A and a portion of conductive layer 564A. The sense line portion 513B includes conductive vias 552a, 554a, 556a, 558a, and 559a, and may include a portion of conductive layer 550a and a portion of conductive layer 562a.

The interconnect 541 includes conductive vertical structures 570A and 572A and conductive layer 575. The interconnect 541 couples the sense line 511 to the sense amplifier 531. The interconnect 543 includes a conductive vertical structure 574 and conductive layer 576. The interconnect 543 couples the sense line 513 to the sense amplifier 531. The conductive vertical structures 570A, 572A, and 574a may include conductive vias and/or conductive layers. For example, in the embodiment of FIG. 5, each of the conductive vertical structures 570A and 572A include dual conductive vias and an intermediate conductive layer therebetween.

The conductive layers and conductive vias previously described with reference to the different portions of sense lines 511 and 513, and the interconnects 541 and 543, may include the same conductive material or may include different conductive materials, and may be formed using fabrication technology now known or later developed. Various conductive materials may be used for the conductive layers and/or conductive vias. Non-limiting examples of conductive materials for the conductive layers and/or conductive vias include tungsten, aluminum, copper, doped polysilicon, and conductive materials including combinations such materials. However, other conductive materials may be used as well without departing from the scope of the disclosure.

Figure 6:
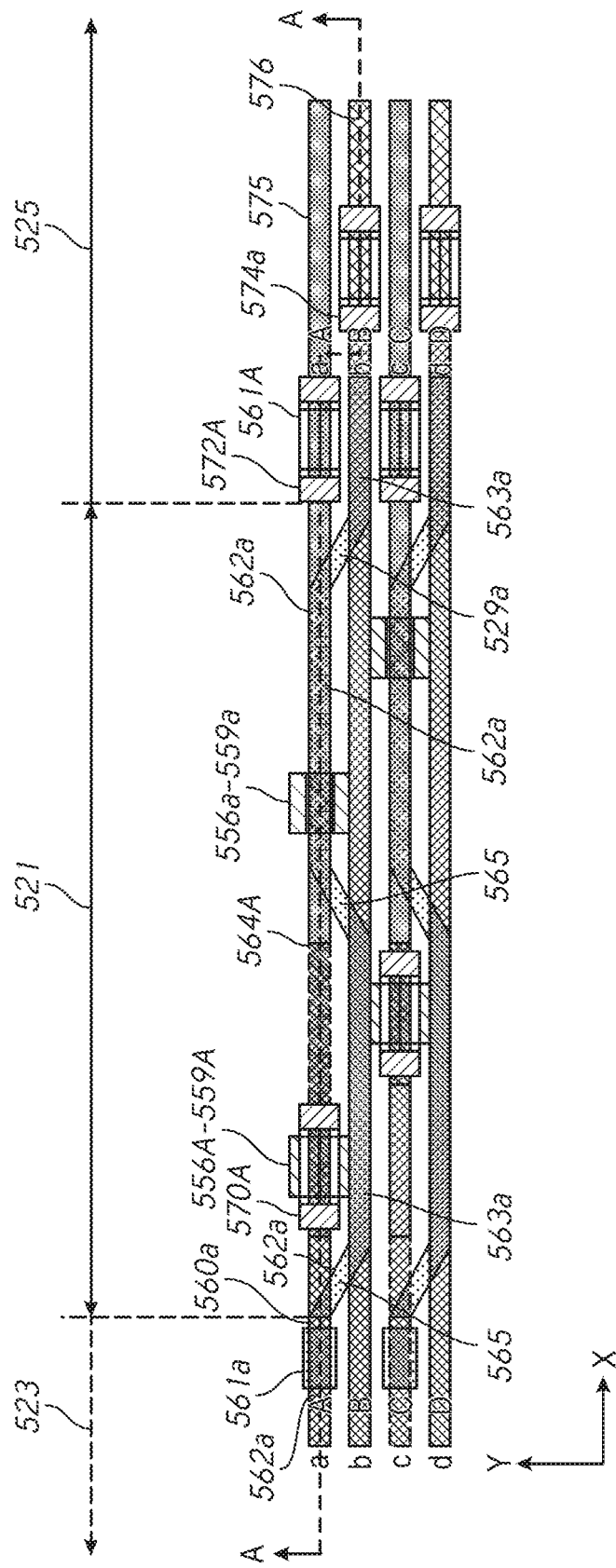
FIG. 6 is a diagram showing a layout of various layers and vias for sense lines according to an embodiment of the disclosure.

FIG. 6 is a diagram showing a layout of various layers and vias for an arrangement of sense lines according to an embodiment of the disclosure. The layout of FIG. 6 may be representative of a layout for the arrangement of sense lines shown in FIG. 5 in some embodiments of the disclosure. For ease of explanation, reference numbers for the arrangement of sense lines of FIG. 5 are also used in the layout of FIG. 6. The cross-section diagram of FIG. 5 shows the view of the layout of FIG. 6 at cut line A-A.

As shown in FIG. 6, the conductive layer 562a of the sense line portion 513A and the sense line portion 513B bends laterally (along an x-y plane) around conductive via 559A and conductive layer 564A of the sense line portion 511B. The conductive layer 562A further bends back to couple the sense line portion 513A with the sense line portion 513B. The conductive layer 562a also bends laterally around conductive via 561A and conductive layer 564A. The conductive layer 562a couples the sense line 513 to sense amplifier 531 through the conductive vertical structure 574a and conductive layer 576 of the interconnect 543.

The conductive layer of the sense line portion 513A and sense line portion 513B includes portions 662a that are aligned longitudinally along the x-direction with the conductive layer 564a of the sense line portion 511B. The conductive layer 562a of the sense line portion 513A and sense line portion 513B also includes portions 663a that are aligned longitudinally along the x-direction with the conductive layer of an adjacent sense line. The portions 662a and 663a of the sense line portions 513A and 513B are coupled into an electrically continuous sense line by bend portions 665. The bend portions 665 include a lateral component (e.g., along the y-direction) relative to the x-direction to cross from alignment with a sense line to alignment with an adjacent sense line.

The conductive layer 564A of the sense line portion 511B and 511O may include discontinuous sections that are coupled into an electrically continuous sense line through the interconnect 541 (e.g., conductive vertical structures 570A and 572A, and conductive layer 575). In such arrangements, the conductive vertical structures and layers of interconnect 541 may be considered to be shared with the sense line portions 511B and 511C. The discontinuous sections of the conductive layer 564A may be positioned in an area provided by the bends in the conductive layer 562a. The conductive layers 562a and 564A of the sense line portions 513A and 513B, and 511B and 511C, may be formed from the same conductive layer. In some embodiments of the disclosure, however, 562a and 564A are formed using separate mask (e.g., photolithographic) steps and/or separate etch steps.

Bending the conductive layer 562a of the sense line portions 513A and 513B in the array gap 521 around conductive structures and layers for the sense line portions 511B and 511C allows for the twisting of the sense lines 511 and 513 in the array gap 521. Such an arrangement may also be used in some embodiments of the disclosure for coupling to a sense amplifier 531 that is positioned below the sense lines 511 and/or 513. The arrangement may also be used in some embodiments of the disclosure for coupling to a sense amplifier 531 that is positioned beneath the sense lines 511 and/or 513, and have a portion or be entirely positioned in an array region in some embodiments of the disclosure.

FIG. 6 further illustrates another pair of sense lines (e.g., sense lines C and c) that are twisted in the array gap 521. The sense lines C and c may have the same arrangement along cut line A-A as sense lines 511 and 513 previously described. The pairs of sense lines B and b, and D and d are not twisted however. The twisted sense lines of A and a, and C and c, are disposed between not-twisted sense line. The layout of FIG. 6 may be replicated to provide more sense lines in the interleaved pattern of twisted sense lines and not-twisted sense lines.

The conductive layers and conductive vias previously described with reference to the different portions of sense lines and the interconnects of FIG. 6, may include the same conductive material or may include different conductive materials, and may be formed using fabrication technology now known or later developed. Various conductive materials may be used for the conductive layers and/or conductive vias. Non-limiting examples of conductive materials for the conductive layers and/or conductive vias include tungsten, aluminum, copper, doped polysilicon, and conductive materials including combinations such materials. However, other conductive materials may be used as well without departing from the scope of the disclosure.

From the foregoing it will be appreciated that, although specific embodiments of the disclosure have been described herein for purposes of illustration, various modifications may be made without deviating from the spirit and scope of the disclosure. Accordingly, the scope disclosure should not be limited any of the specific embodiments described herein.

What is claimed is:

1. An apparatus, comprising:
   a memory cell; and
   a pair of sense lines including a twist portion, at least one sense line of the pair of sense lines coupled to the memory cell and including a vertical component in the twist portion that couples first and second sense line portions of the at least one sense line of the pair of sense lines to provide an electrically continuous sense line.

2. The apparatus of claim 1 wherein the twist portion is disposed in a region between first and second array regions.

3. The apparatus of claim 1 wherein a first sense line of the pair of sense lines includes the vertical component in the twist portion and a second sense line of the pair of sense line includes bend portions to bend laterally around the conductive via.

4. The apparatus of claim 1 wherein the first and second sense line portions of the at least one sense line are at two different layers.

5. The apparatus of claim 1, further comprising a second pair of sense lines adjacent the pair of sense line including the twist portion, the second pair of sense lines not twisted and the first and second sense lines of the second pair of sense lines at two different layers.

6. The apparatus of claim 5, further comprising a third pair of sense lines adjacent the second pair of sense lines, the third pair of sense line including a twist portion.

7. The apparatus of claim 1 wherein the vertical component comprises a conductive via.

8. The apparatus of claim 1, further comprising a second memory cell, wherein the second memory cell is coupled to a cell plate and further coupled to a first portion of a first sense line of the pair of sense lines, and the memory cell is coupled to the cell plate and further coupled to a first portion of a second sense line of the pair of sense lines, the first portion of the second sense line at a layer beneath the first portion of the first sense line.

9. The apparatus of claim 1, further comprising a sense amplifier coupled to the pair of sense lines through respective interconnects.

10. An apparatus, comprising:
    first and second array regions, and an array gap disposed therebetween; and
    a plurality of pairs of sense lines electrically continuous through first and second array regions and through the array gap,
    wherein at least one pair of sense lines of the plurality of pairs of sense lines includes sense line portions in the array gap to twist the sense lines of the pair of sense lines, the sense line portions in the array gap having vertical components to couple a first conductive layer to a second conductive layer that is below the first conductive layer.

11. The apparatus of claim 10 wherein the at least one pair of sense lines of the plurality of pairs of sense lines includes a first sense line and a second sense line, wherein the first sense line includes a via and wherein the second sense line includes a first conductive portion aligned longitudinally with a portion of the first sense line, a second conductive portion aligned longitudinally with a portion of an adjacent sense line, and a third conductive portion having a lateral component to couple the first conductive portion with the second conductive portion to bend the second sense line around the via of the first sense line.

12. The apparatus of claim 11 wherein the first sense line includes a discontinuous section of a conductive layer coupled to the via and positioned in an area provided by the third conductive portion having a lateral component to bend the second sense line around the via of the first sense line, wherein the discontinuous section of the conductive layer is aligned longitudinally with the first conductive portion of the second sense line.

13. The apparatus of claim 11 wherein the plurality of pairs of sense lines further includes pairs of sense lines disposed between the pairs of twisted sense lines and that include sense line portions in the array gap that do not twist the sense lines.

14. The apparatus of claim 10 wherein at least one of the vertical components comprises:
    a conductive layer; and
    a conductive vertical structure.

15. The apparatus of claim 14 wherein the conductive vertical structure comprises a plurality of conductive vias.

16. An apparatus, comprising:
    a first array region including first portions of a plurality of sense lines and further including memory cells coupled to the first portions of the plurality of sense lines;
    a second array region including second portions of the plurality of sense lines and further including memory cells coupled to the second portions of the plurality of sense lines; and
    an array gap disposed between the first and second array regions and including third portions of the plurality of sense lines, the third portions of the plurality of sense lines coupled to the first and second portions of at least some of the plurality of sense lines and configured to provide a vertical twist to respective pairs of sense lines.

17. The apparatus of claim 16 wherein the array gap further includes fourth portions of the plurality of sense lines, the fourth portions of the plurality of sense lines coupled to other ones of the plurality of sense lines and configured to provide respective pairs of sense lines without a vertical twist.

18. The apparatus of claim 16 wherein the third portions of the plurality of sense lines include vertical components disposed in the array gap.

19. The apparatus of claim 16 wherein the first portions of the plurality of sense lines includes a portion of a first conductive layer and further includes a portion of a second conductive layer disposed below the portion of the first conductive layer, and wherein second portions of the plurality of sense lines includes a portion of the first conductive layer and further includes a portion of the second conductive layer disposed below the portion of the first conductive layer.

20. The apparatus of claim 19 wherein the third portions of the plurality of sense lines include at least one of a conductive via, a bend portion, a discontinuous section of the first or second conductive layer, or combinations thereof.

* * * * *